(12) United States Patent
Hsu

(10) Patent No.: US 6,269,008 B1
(45) Date of Patent: Jul. 31, 2001

(54) MULTI-WALLED ELECTROMAGNETIC INTERFERENCE SHIELD

(75) Inventor: Gour-Wen Hsu, Cedar Knolls, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/444,450

(22) Filed: Nov. 22, 1999

(51) Int. Cl.[7] ............................................ H05K 9/00
(52) U.S. Cl. ...................... 361/816; 361/800; 361/818; 174/35 R
(58) Field of Search .................................. 361/800, 801, 361/816, 818; 174/35 R, 35 GC; 206/719

(56) References Cited

U.S. PATENT DOCUMENTS

| | | | |
|---|---|---|---|
| 4,218,578 | * | 8/1980 | Oschewski et al. ............... 174/35 R |
| 4,370,515 | * | 1/1983 | Donaldson ......................... 174/35 R |
| 5,045,971 | * | 9/1991 | Ono et al. ............................ 361/816 |
| 5,414,597 | * | 5/1995 | Lindland et al. .................... 361/816 |
| 5,550,324 | * | 8/1996 | Black et al. ......................... 174/52.3 |
| 5,844,784 | * | 12/1998 | Moran et al. ........................ 361/818 |
| 5,847,938 | * | 12/1998 | Gammon ............................. 361/818 |

FOREIGN PATENT DOCUMENTS

405206674 * 8/1993 (JP) .
405335773 * 12/1993 (JP) .

* cited by examiner

Primary Examiner—Jayprakash N. Gandhi

(57) ABSTRACT

An electromagnetic shield includes a multi-walled cover with a peripheral gap between inner walls and outer walls. An shielding gasket may be mounted in the peripheral gap. The electromagnetic shield further includes a fence disposed within the peripheral gap and arranged for mounting on a printed circuit board. The electromagnetic shield provides a barrier to electromagnetic signals from being radiated between an interior of the electromagnetic shield and an exterior.

13 Claims, 3 Drawing Sheets

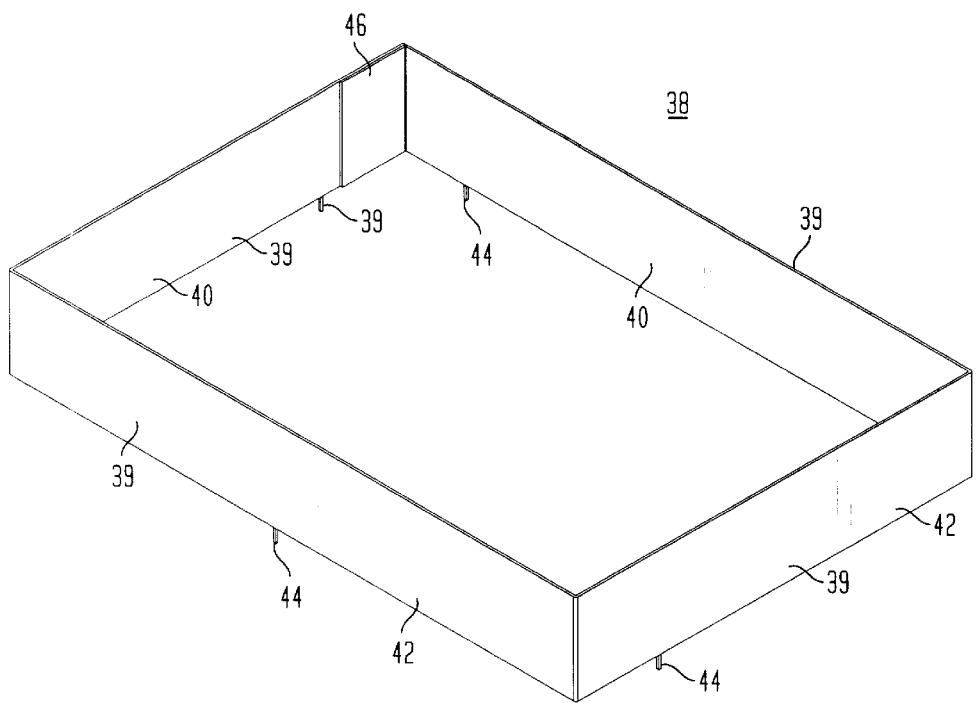
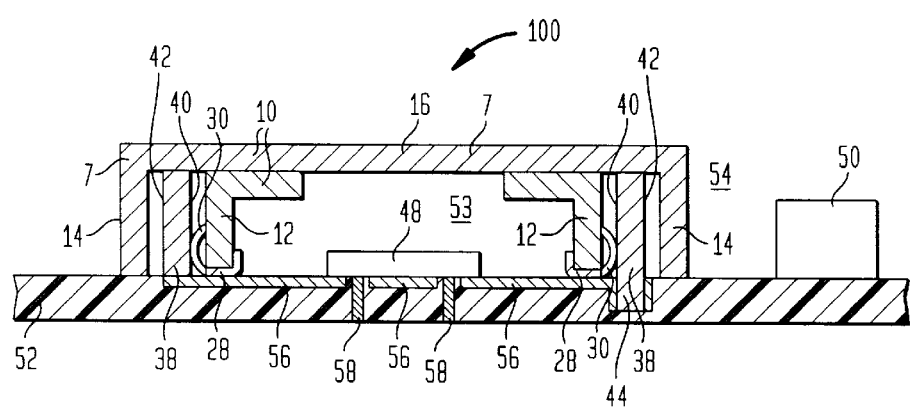

MULTI-WALLED ELECTROMAGNETIC INTERFERENCE SHIELD

FIELD OF THE INVENTION

This invention relates to an electromagnetic interference shield for a printed circuit board and more particularly to a multi-walled electromagnetic interference shield.

BACKGROUND OF THE INVENTION

In an electronic device operating at radio frequencies or microwave frequencies, certain circuit components may emit electromagnetic fields that amount to interference to other circuit components in the vicinity. Such unimpeded electromagnetic interference may degrade the performance of a wireless communications transmitter incorporated into a base station, for example. In some cases, if electromagnetic interaction between the circuit components is severe, an amplifier may become unstable from an electromagnetic feedback path and go into undesired oscillation. In other situations, the electromagnetic interference may degrade amplifier performance by causing inter-modulation distortion or by spreading the bandwidth of the transmit signal beyond its desired boundaries. Inter-modulation distortion refers to unwanted mixing that can occur between two signals at different frequencies within electronic circuitry.

To alleviate the foregoing problems, manufacturers have used what are commonly referred to as can shields mounted on printed circuit boards to electromagnetically isolate circuit components from one another. The prior designs of electromagnetic shields often address frequencies lower than one Gigahertz (1 GHz) because of the prevalent use of these lower frequencies in wireless communication systems over the last 20 years. However, as wireless systems are now licensed to use higher frequencies such as those greater or equal to 1.8 Gigahertz for personal communication services (PCS), some of the earlier shield designs do not provide adequate isolation between different components of a printed circuit board. Thus, a need exists for an electromagnetic shield that is applicable to printed circuit boards operating at microwave frequencies or at other frequencies.

SUMMARY OF THE INVENTION

In accordance with the invention, an electromagnetic shield includes a multi-walled cover with a peripheral gap between inner walls and outer walls. A shielding gasket may be mounted in the peripheral gap. The electromagnetic shield further includes a fence disposed within the peripheral gap and arranged for mounting on a printed circuit board. The electromagnetic shield provides a barrier to electromagnetic to signals from being radiated between an interior of the electromagnetic shield and an exterior. The electromagnetic shield is well-suited for providing electromagnetic attenuation and isolation in the lateral directions between the shield and other components on a printed circuit board by suppressing radiation at the inner walls, the fence, the shielding gasket, and the outer walls of the shield.

BRIEF DESCRIPTION OF THE DRAWINGS

FIG. 3 is a perspective view of a fence in accordance with the invention.

FIG. 4 is a cross-sectional view of an assembled electromagnetic interference shield in accordance with the invention.

DETAILED DESCRIPTION OF A PREFERRED EMBODIMENT

Figure 1:
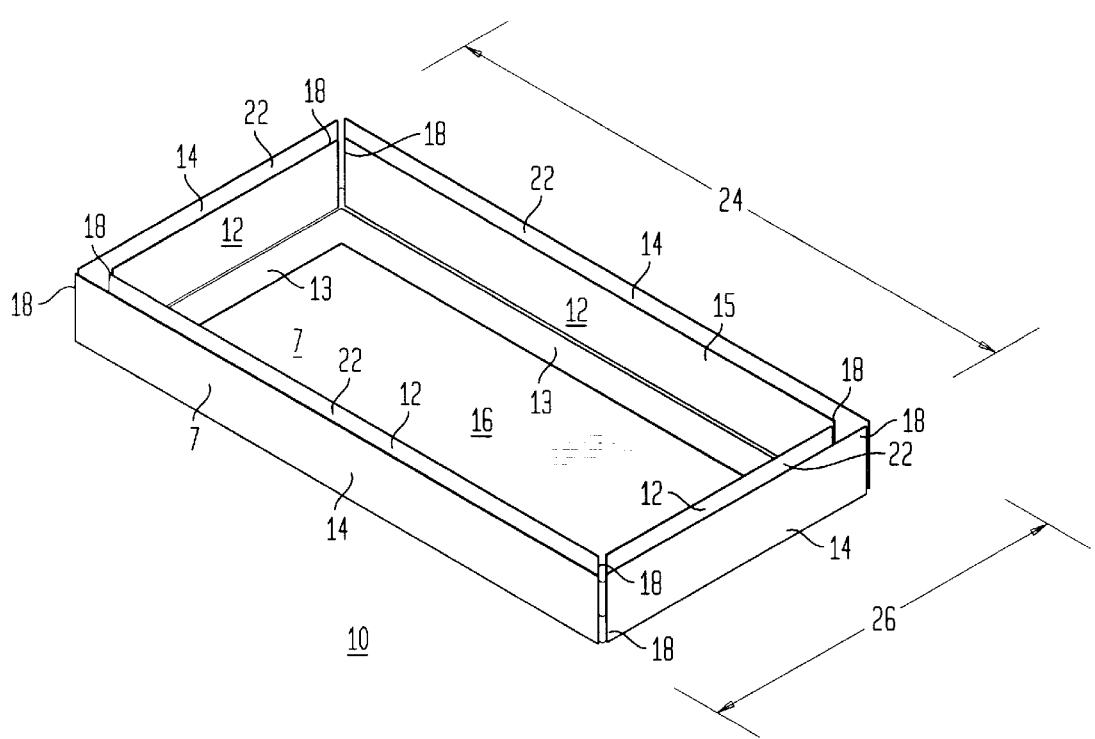
FIG. 1 is a prospective view of a multi-walled cover in accordance with the invention.

In accordance with a preferred embodiment of the invention, FIG. 1 illustrates a multi-walled cover 10, which is turned upside down to better show various features. A multi-walled cover 10 refers to dual-walled cover or any other cover with two or more walls. The multi-walled cover 10 includes inner walls 12 attached to an outer cover 7. The outer cover 7 has a top 16 with outer walls 14 extending from the top 16 at generally orthogonal angles to the top 16. Although the top 16 is preferably substantially rectangular as shown, in alternate embodiments the top 16 may have any geometric shape, including a generally circular shape or a polygonal shape. The outer cover 7 can be formed out of sheet metal or otherwise. For example, the outer cover 7 may be stamped from sheet metal. Vertical corners 18 of the inner walls 12 and the outer walls 14 define gaps that can be filled with solder or conductive adhesive to provide a greater barrier against the propagation of electromagnetic energy.

The multi-walled cover 10 generally has the shape of a box with one missing or open side. The missing or open side represents a bottom of the multi-walled cover 10 while the opposite side represents the top 16 of the multi-walled cover 10. An interior of the top 16 provides a mounting surface for attaching a base portion 13 of the inner walls 12 to the top 16. The base portion 13 is preferably substantially orthogonal with respect to a wall portion 15 of the inner walls 12. The inner walls 12 may be made from metallic sheet stock that is stamped or bent into a generally rectangular appearance with an L-shaped cross-section. The inner walls 12 may be welded, bonded, fastened, soldered or otherwise attached to the top 16 of the outer cover. For example, the inner walls 12 may be attached to the top 16 by conductive adhesive or welded to electrically connect the inner walls 12 to top 16. In an alternate embodiment, the inner walls and the top may be integrally formed or cast as a unitary body.

Figure 2:
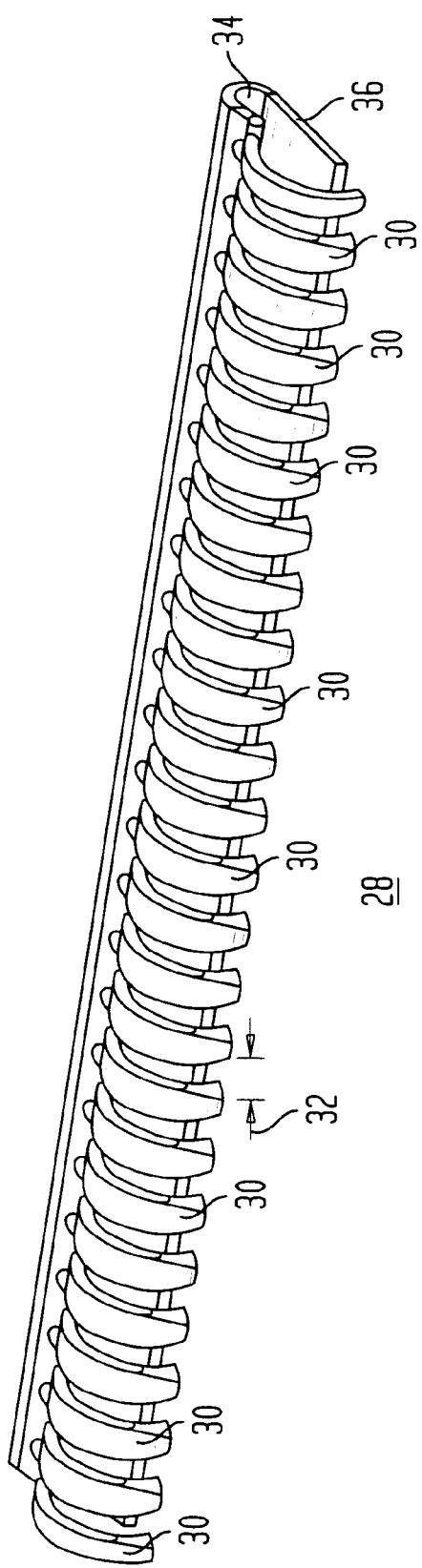
FIG. 2 illustrates a clip-on gasket that may be sized in segments for cooperation with the multi-walled cover of FIG. 1.

A peripheral gap 22 is formed between the inner walls 12 and the outer walls 14 of the outer cover. The peripheral gap 22 has a clearance selected to provide adequate room for mounting a shielding gasket 28, as shown in FIG. 2. The shielding gasket 28 is preferably cut to length to coincide with a length 24 associated with the multi-walled cover 10 and to coincide with a width 26 of the multi-walled cover 10. The length 24 and the width 26 are determined in accordance with the internal dimensions of the peripheral gap 22 to permit the shielding gasket 28 to be mounted within the peripheral gap 22 to promote attenuation of electromagnetic signals.

In one embodiment, the shielding gasket 28 comprises a clip-on gasket that is preferably clipped onto the inner walls 12 of the multi-walled cover 10 with the fingers 30 located between the inner walls 12 and the outer walls 14 within the peripheral gap 22 to provide attenuation of electromagnetic signals that might otherwise traverse the peripheral gap 22. A height of the inner walls 12 may be less than a height of the outer walls 14 to permit mounting of the multi-walled cover 10 with the shielding gasket 28 in a flush manner with respect to a planar printed circuit board. Thus, the shielding gasket 28 prevents or reduces radiation exchange between an interior and an exterior of the dual walled cover 10. As shown, the shielding gasket 28 includes a recess 34 for engaging an inner wall 12 and a planar portion 36 for resting against the inner wall 12. Although the shielding gasket 28 is described as mounted on the inner walls 12 herein as an example, in an alternate embodiment the shielding gasket 28 may be mounted on the outer walls 14.

In FIG. 3, a fence 38 is illustrated for use with the multi-walled 10 cover of FIG. 1. The fence 38 preferably has mating tabs 44 that may be inserted into corresponding conductive holes in a printed circuit board. The fence 38 may be attached to the printed circuit board by flowing or soldering the tabs 44 to one or more conductive holes in the printed circuit board. For example, the fence 38 may be electrically connected to a ground plane of the printed circuit board by soldering the tabs 44 to the ground plane.

In an alternate embodiment, an alternate fence includes surface-mounting pads orthogonally extending from walls of the alternate fence. For example, such surface- mounting pads may be formed by bending tabs 48 at approximately a right angle to the wall exterior of the fence 38. The surface-mounting pads are arranged to electrically, and mechanically connect the fence to metallic traces of a printed circuit board in accordance with surface-mounting procedures.

The fence 38 has a generally rectangular shape or any other geometric shape that coincides with dimensions of the peripheral gap 22 of the multi-walled cover 10. The shield fence 38 preferably has solid, planar, and rectangular metallic walls 39. The metallic walls 39 may be formed of sheet metal stock by joining the walls 39 at a connection region 46 (e.g., near a corner) by soldering, welding, bonding with conductive adhesive, brazing or by another suitable and electrically conductive method of mechanical attachment. Preferably, the joint of the connection region 46 provides a good, low resistance electrical connection that is not susceptible to the production of inter-modulation distortion.

As best illustrated in FIG. 4, the fence 38 provides a mounting base for the multi-walled cover 10. The fence is preferably connected to a ground plane 56 of a printed circuit board 52 via the tabs 44 to provide a secure mounting base. The ground plane 56 forms an electromagnetic barrier that cooperates with the electromagnetic interference shield 10 to form a generally boxy metallic shielding container. A first electrical component 48 may be located in the interior 53 of the electromagnetic shield 100. A second electrical component 50 may be located on the exterior 54 of the electromagnetic shield 100 and laterally separated from the first electrical component 48 on the printed circuit board 52. The first electrical component 48 may be connected to other electrical components on the circuit board 52 or elsewhere by conductive through-holes 58 in the printed circuit board 52.

The multi-walled cover 10 is slipped onto the fence 38 after the shielding gasket 28 is attached to each inner wall 12 of the multi-walled cover 10. The rectangular dimension of the fence 38 coincides with the rectangular dimension of the peripheral gap 22 such that the multi-wall cover 10 slides over the fence 38 with some minimal interference between the shielding gasket 28 in the fence 38 to secure the multi-walled cover 10 to the fence 38 by compressive forces of the shielding gasket 28 pressing against the wall interior 40 of the fence 38. A wall exterior 42 opposite the wall interior 40 faces the outer wall 14. The shielding gasket 28 has a plurality of fingers 30 and is preferably made of spring steel to resiliently apply sufficient tension between the fence 38 and the inner walls 12 to retain the multi-walled cover 10 on the fence 38.

The inner walls 12 of the multi-walled cover 10 rest in the inside of the fence 38 while the outer walls 14 rest on the outside of the fence 38 when assembled. Accordingly, in one embodiment the overall structure provides as many as three vertical walls of attenuation of electromagnetic signals. Further, the shielding gasket 28 may contribute toward the attenuation of electromagnetic signal that is over 1 Gigahertz in frequency based on the fractional wavelength spacing 32 between the adjacent fingers 30 which may in essence provide an electrical short at the frequency of operation or at least a high resistance path of propagation at the frequency of interest.

The triple-wall structure, including the inner wall 12, the fence 38, and the outer wall 14, provides significant attenuation of electromagnetic interference between components mounted on a printed circuit board 52 or other surrounding electrical components. The triple-wall structure of the assembled electromagnetic shield 100 is particularly effective for the reduction of interference to laterally displaced elements, such as the first electrical component 48 and the second electrical component 50, on a printed circuit board 52. Laterally displaced elements are those elements that are mounted generally on the same plane or surface as the electromagnetic shield 100. Nevertheless, the electromagnetic shield 100 can effectively shield elements with other spatial relationships, rather than laterally spaced relationships, and such applications of the electromagnetic shield 100 fall within the scope of the invention.

The interior 53 of the electromagnetic shield 100 is electromagnetically isolated from the exterior 54 about the electromagnetic shield 100 such that electromagnetic signals generated by an amplifier, such as a linear microwave power amplifier, placed within the electromagnetic shield 100 are sufficiently attenuated to avoid inter-modulation products with nearby amplification equipment or other components. Further, the introduction of distortion components from nearby transmitters and such, is prevented from entering from an exterior 54 of the electromagnetic shield 100 to the interior 53 of the electromagnetic shield 100 where intermodulation components may otherwise be introduced into the power amplification output. Such introduction of non-linearities into the output signal may result in spectral spreading of the output signal or violation of bandwidth emission standards such as those promulgated by The Federal Communications Commission in the U.S.

The structure of the electromagnetic shield 100 is readily fabricated from sheet metal stock and is relatively inexpensive to manufacture. The tolerances of the fence 38 and the multi-walled cover 10 are somewhat forgiving because the resilient shielding gasket 28 is able to compensate for some manufacturing variations or deviations of squareness in the fence 38 or in the multi-walled cover 10. Hence, assembly difficulties that might otherwise result are avoided potentially reducing scrap materials for fence 38s or multi-walled covers 10 that might not comply with the strict tolerances. The cover in the fences 38 may be made to virtually any dimensions to accommodate the smaller circuitry components or larger power amplification components of circuits in a high-powered linear amplifier, for example.

The specification describes various illustrative embodiments of the invention, the scope of the claims is intended to cover various modifications and equivalent arrangements of the illustrative embodiments enclosed in the specification. Therefore, the following claims should be accorded the reasonable and broadest interpretation to cover modifications, equivalent structures and features that are consistent with the spirited scope of the invention disclosed herein.

The following is claimed:

1. An electromagnetic shield for suppressing electromagnetic interference to circuit components, the electromagnetic shield comprising:
   a multi-walled cover having a top, inner walls and outer walls extending downward from the top with a peripheral gap between the inner walls and the outer walls;
   a shielding gasket mounted in the peripheral gap; and
   a fence disposed in the peripheral gap, the fence adapted for mounting on a printed circuit board.

2. The electromagnetic shield according to claim 1 wherein the shielding gasket comprises a clip-on gasket for attachment to at least one of the inner walls, and wherein the shielding gasket includes a series of teeth arranged resting in the peripheral gap.

3. The electromagnetic shield according to claim 1 wherein the clip-on gasket resiliently provides tension between the inner walls of the multi-walled cover and interior walls of the fence.

4. The electromagnetic shield according to claim 1 wherein the multi-walled cover is mounted on the fence such that the outer walls surround the fence and the inner walls are located inside the fence, to provide a barrier to electromagnetic radiation between an interior of the electromagnetic shield and an exterior of the electromagnetic shield.

5. The electromagnetic shield according to claim 1 wherein the inner walls, the outer walls, and the fence cooperate to provide electromagnetic shielding in lateral directions from the electromagnetic shield.

6. The electromagnetic shield according to claim 1 wherein the inner walls are mechanically and electrically connected to the top.

7. The electromagnetic shield according to claim 1 wherein the inner walls form a generally rectangular member with an L-shaped cross section.

8. The electromagnetic shield according to claim 1 wherein corners of the outer walls are sealed with conductive adhesive or solder to prevent the transfer of an electromagnetic signal between an interior and an exterior of the electromagnetic shield.

9. The electromagnetic shield according to claim 1 further comprising a power amplifier operating at a microwave frequency contained within the inner walls and the top of the electromagnetic shield.

10. An electromagnetic shield for suppressing electromagnetic interference to circuit components, the electromagnetic shield comprising:
    a multi-walled cover having a planar metallic top, at least one metallic inner wall and at least one metallic outer wall extending downward from the top with a peripheral gap between the at least one inner wall and the at least one outer wall;
    an electrically conductive shielding gasket mounted in the peripheral gap; and
    a metallic fence disposed in the peripheral gap, the fence adapted for mounting on a printed circuit board.

11. The electromagnetic shield according to claim 10 wherein the top has a generally rectangular shape and wherein the at least one metallic inner wall and the at least one metallic outer wall are substantially planar.

12. The electromagnetic shield according to claim 10 wherein the fence includes a plurality of mounted tabs for electrical and mechanical connection to at least one trace of a printed circuit board.

13. The electromagnetic shield according to claim 10 wherein the fence includes a plurality of mounting pads extending outward from exterior walls of the fence, the mounting pads arranged for electrical and mechanical connection to at least one trace of the printed circuit board.

* * * * *